United States Patent [19]

Yoshida

[11] 4,423,492

[45] Dec. 27, 1983

[54] SEMICONDUCTOR MEMORY DEVICE

[75] Inventor: Masanobu Yoshida, Kawaguchi, Japan

[73] Assignee: Fujitsu Limited, Kawasaki, Japan

[21] Appl. No.: 329,939

[22] Filed: Dec. 11, 1981

[30] Foreign Application Priority Data

Dec. 18, 1980 [JP] Japan .................................. 55-179253

[51] Int. Cl.³ .............................................. G11C 7/00
[52] U.S. Cl. ..................................... 365/226; 307/297
[58] Field of Search ................. 365/226, 229; 307/297

[56] References Cited

U.S. PATENT DOCUMENTS

4,368,524 1/1983 Nakamura et al. .................. 365/226

Primary Examiner—Terrell W. Fears
Attorney, Agent, or Firm—Staas & Halsey

[57] ABSTRACT

A semiconductor EPROM device which comprises a plurality of floating gate type memory cell transistors and in which the threshold potential of the memory cell transistors is measured by changing the potential of a second power supply terminal to which is originally connected a high potential used for programming the EPROM device.

10 Claims, 9 Drawing Figures

SEMICONDUCTOR MEMORY DEVICE

BACKGROUND OF THE INVENTION

1. Field of the Invention

The present invention relates to a semiconductor memory device, more particularly to an EPROM (Erasable and electrically Programmable Read Only Memory) device which is used, for example, in an electronic computer and in which the threshold potential of each memory cell can be measured accurately and easily.

2. Description of the Prior Art

Figure 1:
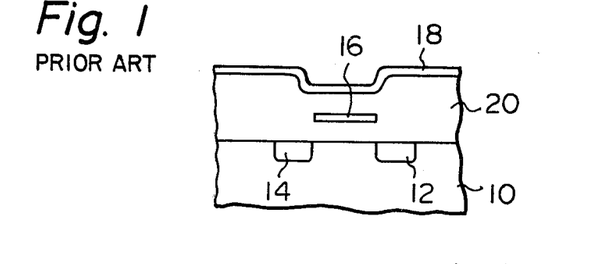
FIG. 1 is a cross-sectional view illustrating a memory cell having a floating gate electrode used in a conventional EPROM device.

As illustrated in FIG. 1, a memory cell of an EPROM device comprises a source electrode 12, a drain electrode 14, a floating gate electrode 16, and a control gate electrode 18 which are formed on a semiconductor substrate 10. In the EPROM device, information "0" is written in by applying a high reverse-biased potential voltage to the drain junction in order to cause an avalanche breakdown therein and to inject hot electrons into the floating gate electrode 16 through an insulating layer 20. Information "1" is written, i.e., the information "0" in the memory cell is erased by radiating ultraviolet light into the memory cell, thereby dissipating the electrons stored in the floating gate electrode 16. When electrons are injected into the floating gate 16, i.e., when information "0" is stored in the memory cell, the electric field caused by the control gate 18 has little effect on the channel region between the source and the drain electrode, thereby resulting in a threshold potential Vth for the control gate 18 higher than that in the condition when information "1" is stored in the memory cell. For example, when electrons are injected into the floating gate 16, the threshold potential Vth is 10.0 V. When the electrons are not injected, the threshold potential Vth is 2.5 V. Therefore, during the readout of information, the potential of the control gate 18 is set to a value smaller than 10.0 V and larger than 2.5 V. Therefore, if electrons are injected into the floating gate 16, the memory cell transistor of FIG. 1 is turned off. If the electrons are not injected into the floating gate 16, the memory cell transistor remains in the turned on condition, this enables readout of information "1" or "0" stored in the memory cell.

The most important characteristics of the EPROM device are the magnitude of the threshold potential Vth and the stability of this magnitude. If the insulating resistance of the insulation layer 20 is not sufficiently large, the electrons stored in the floating gate electrode 16 are dissipated or the electrons are injected into the floating gate electrode 16 from the surroundings, whereby the magnitude of the threshold potential Vth is changed during, for example, readout of information from the memory cell or writing of information into adjacent memory cells or during changes in ambient temperature. A change of the threshold potential Vth of an EPROM cell beyond an acceptable range makes an EPROM cell unusable. To test whether the change of the threshold potential Vth is within the acceptable range, it is necessary to measure the magnitude of the threshold potential Vth.

Figure 2:
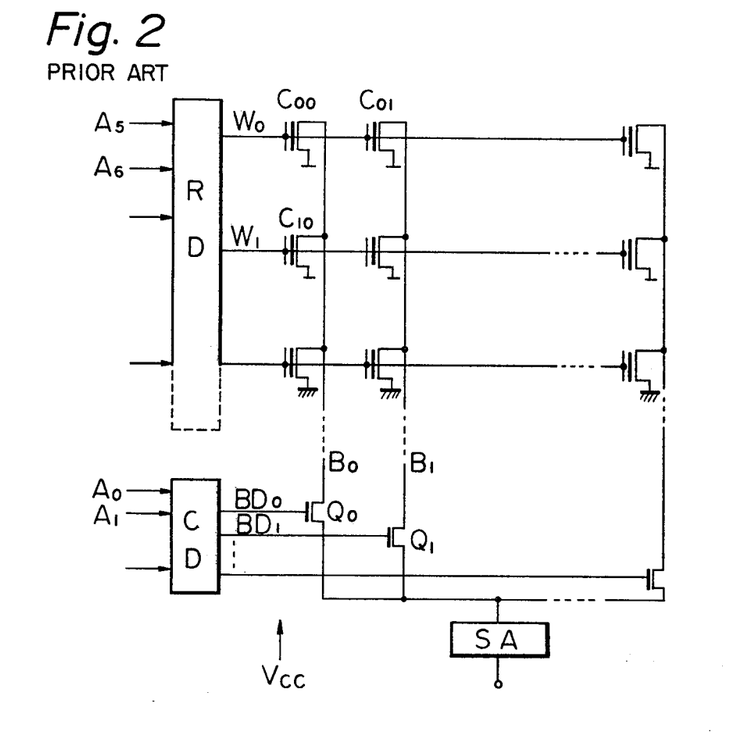
FIG. 2 is a schematic block circuit diagram illustrating a conventional EPROM device which uses the memory cells of FIG. 1.

FIG. 2 illustrates a schematic structure of a conventional EPROM device. In FIG. 2, W0, W1, ... are word lines, i.e., row lines; B0, B1, ... are bit lines, i.e., column lines; Q0, Q1, ... are column selecting transistors; SA is a sense amplifier; RD is a row decoder; CD is a column decoder; and A0, A1, ... and A5, A6, ... are address bit signals. C00, C01, ... are EPROM cells, each of which has the structure of FIG. 1 and each of which is disposed at the intersection of a word line and a bit line and connected therebetween. Conventionally, when measuring the threshold potential Vth of each of the memory cells, one of the memory cells, for example, C00, is selected by the row decoder RD and the column decoder CD and the power supply voltage to the EPROM device is changed. More particularly, the transistor Q0 is turned on so that the sense amplifier SA is connected to the memory cell C00, and the potential Vcc of the operating power source is changed from a low potential level to a high potential level so that the potential of the word line W0 changes gradually from the low potential level, e.g., 0V, to the high potential level. Since the memory cell transistor C00 is in a turned-off condition at first, no current flows through the bit line B0. When the potential of the word line W0 is gradually increased and reaches a certain value, the cell transistor C00 is turned on and a current flows through the bit line B0. This current is detected by the sense amplifier SA, and a potential of the word line W0, i.e., a potential of the power source at the time the current of the bit line B0 is detected, becomes equal to the threshold potential Vth of the memory cell C00.

Figure 3:
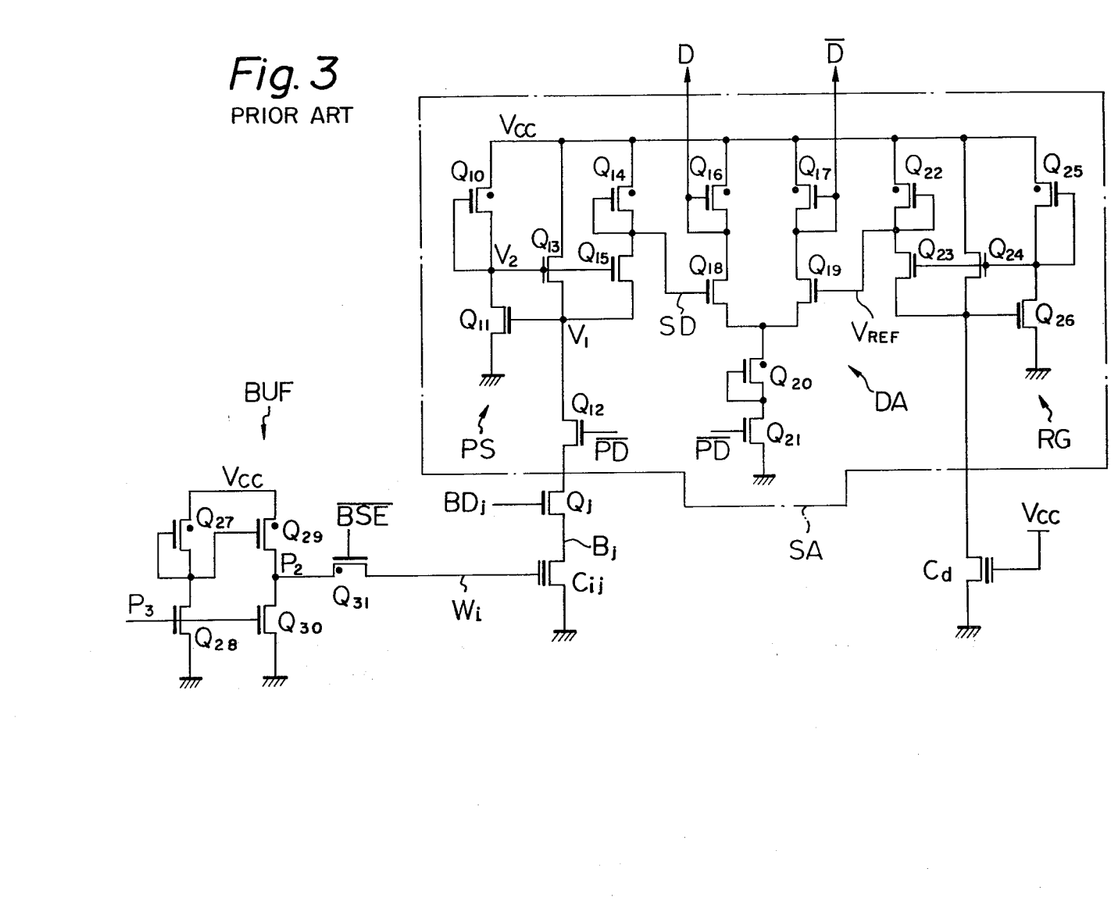
FIG. 3 is a circuit diagram illustrating a sense amplifier of the EPROM device of FIG. 2.

FIG. 3 illustrates a sense amplifier circuit SA used in the EPROM device of FIG. 2. The sense amplifier SA comprises a pre-sense circuit PS composed of transistors Q10 through Q15; a differential amplifier DA composed of transistors Q16 through Q21; and a reference voltage generator RG composed of transistors Q22 through Q26. The pre-sense circuit PS is connected to a memory cell Cij through a column selecting transistor Qj and a bit line Bj. The gate electrode of the memory cell Cij is connected to a word line Wi which is connected to a buffer section BUF of a row decoder. The reference voltage generator RG is connected to a dummy cell Cd whose gate electrode is connected to a power supply voltage Vcc.

In FIG. 3, the readout operation of the memory cell Cij is effected as follows: The potential of a point P3 of the buffer section BUF is changed to low and the potential of the gate electrode of the transistor Q31 is changed to high, so that the transistors Q28 and Q30 are turned off and the transistor Q31 is turned on. Therefore, the potential of the word line Wi becomes nearly as high as Vcc. The column-selecting transistor Qj is also turned on by a signal from a column decoder, so that the memory cell Cij is selected. A powerdown signal $\overline{PD}$ which is used to save power in the memory device is changed to high and the transistors Q12 and Q21 are turned on.

In this condition, if information stored in the memory cell Cij is "0", the memory cell Cij does not turn on, whereby the potential V1 of the gate electrode of transistor Q11 becomes relatively high and the potential V2 of the drain electrode of the transistor Q11, i.e., the potential of the gate electrodes of the transistors Q13 and Q15, becomes relatively low. Therefore, the transistors Q13 and Q15 are turned off and the potential of a sense signal SD becomes high, i.e., Vcc level. On the contrary, if the information stored in the memory cell Cij is "1", the potential of the sense signal SD becomes low, which is nearly equal to V1, e.g., 1 V. In this case, the reference voltage generator RG has substantially the same circuit structure as that of the pre-sense circuit PS except that the reference voltage generator RG does not have a transistor corresponding to the transistor Q12 of the pre-sense circuit PS. The resistance between the drain and the source electrode of the dummy cell transistor Cij is selected so that a reference voltage $V_{REF}$ generated from the reference voltage generator RG becomes a middle value between the high potential level and the low potential level of the sense signal SD when the power supply voltage Vcc is applied to the gate electrode thereof. Therefore, the change of the potential of the sense signal SD between a relatively high level and a relatively low level causes the differential amplifier DA to output a data output signal D which changes between low and high, respectively, and an inverted data output signal $\overline{D}$ thereof.

Figure 4:
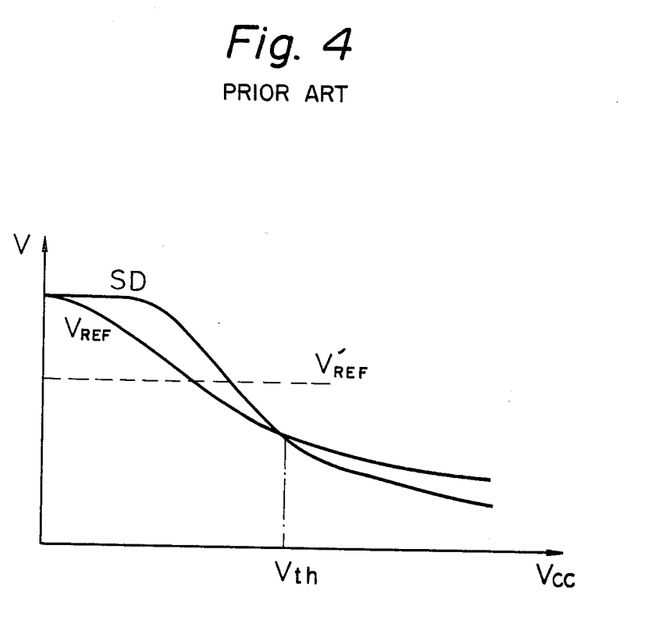
FIG. 4 is a graph illustrating the characteristics of signals appearing in the circuit of FIG. 3.

In the circuit of FIG. 3, the threshold potential Vth of the memory cell, e.g., Cij is measured by changing the potential Vcc of the power supply voltage in the readout mode, as mentioned before. As illustrated in FIG. 4, the potential of the sense signal SD falls in accordance with the potential rise of the power supply voltage Vcc. However, since the resistance between the drain and the source electrode of the dummy cell Cd changes according to the change of the potential Vcc, the reference voltage $V_{REF}$ generated by the reference voltage generator also changes in the same direction as illustrated in FIG. 4. Therefore, in a conventional EPROM device, it is impossible to measure the value of the threshold potential Vth accurately or to reduce the spread of the measured values of the threshold potential Vth of each of the memory cells.

Moreover, in a conventional EPROM device, the sequential measurement of the threshold potential Vth for every memory cell means that the time required for measuring the threshold potential Vth increases considerably with large memory capacities, i.e., when the number of memory cells is large, for example, 64K or 256K.

SUMMARY OF THE INVENTION

It is, therefore, an object of the present invention to provide a semiconductor memory device in which the threshold potential of memory cells can be measured precisely.

It is another object of the present invention to provide a semiconductor memory device in which the spread in the measured values of the threshold potential of each of the memory cells is small.

It is still another object of the present invention to provide a semiconductor memory device in which the threshold potentials of a plurality of memory cells can be checked rapidly.

According to the present invention, there is provided a semiconductor memory device comprising a plurality of word lines, a plurality of bit lines and a plurality of memory cell transistors each of which is disposed at an intersection of the word lines. The invention also includes a control gate connected to one of the word lines and a floating gate which stores electrons. Further included are a first power supply terminal which receives a normal operating voltage and a second power supply terminal which receives a high voltage used for programming the memory device. The semiconductor memory device further comprises a circuit which connects the second power supply terminal to one or more selected word lines when the measurement of the threshold potential of the memory cell transistors is effected, the first power supply terminal being connected to the normal operating voltage having a constant potential, and the potential of the second power supply terminal being changed, thereby effecting measurement of the threshold potential.

DESCRIPTION OF THE PREFERRED EMBODIMENT

Figure 5:
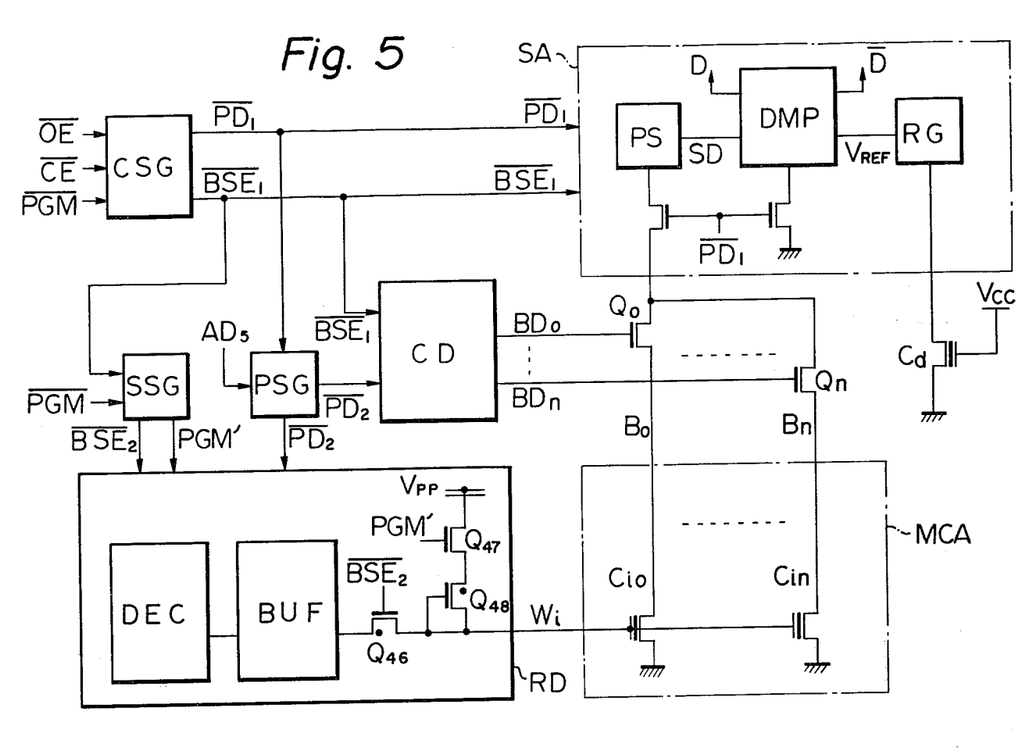
FIG. 5 is a schematic block circuit diagram illustrating an EPROM device as an embodiment of the present invention.

As illustrated in FIG. 5, an EPROM device according to the present invention comprises a memory cell array MCA, a row decoder RD, a column decoder CD, a sense amplifier SA, a dummy cell Cd, a control signal generator CSG, a switching signal generator SSG, a powerdown signal generator PSG, and column selecting transistors Q0 through Qn. The memory cell array MCA comprises memory cells Ci0, ..., Cin, ..., each of which is, for example, the floating gate type MIS transistor illustrated in FIG. 1 and connected between a word line Wi and a corresponding bit line B0 through Bn. The row decoder RD comprises a decoder section DEC which decodes row address signals, a buffer section BUF, and a gate or selection section comprising MIS transistors Q46, Q47, and Q48. The sense amplifier SA has the same structure as that of the sense amplifier circuit of FIG. 3. The control signal generator CSG is a logic circuit which generates a powerdown signal $\overline{PD1}$ and a gate signal $\overline{BSE1}$ on the basis of an output enable signal OE, a chip enable signal CE, and a program signal $\overline{PGM}$ which are applied to the memory device. The powerdown signal $\overline{PD1}$ is a control signal which becomes high in an active mode, i.e., during readout or write-in. The gate $\overline{BSE1}$ is a control signal which becomes low during programming, i.e., write in, and which becomes high during readout. The program signal $\overline{PGM}$ is a control signal which also becomes low during writein and high during readout. The switching signal generator SSG generates a modified gate signal $\overline{BSE2}$ and a modified program signal PGM', which are applied to the row decoder RD from the base enable signal $\overline{BSE1}$, and a program signal $\overline{PGM}$. The powerdown signal generator PSG generates a modified powerdown signal $\overline{PD2}$ based on the powerdown signal $\overline{PD1}$ and an address bit signal AD5.

Figure 6:
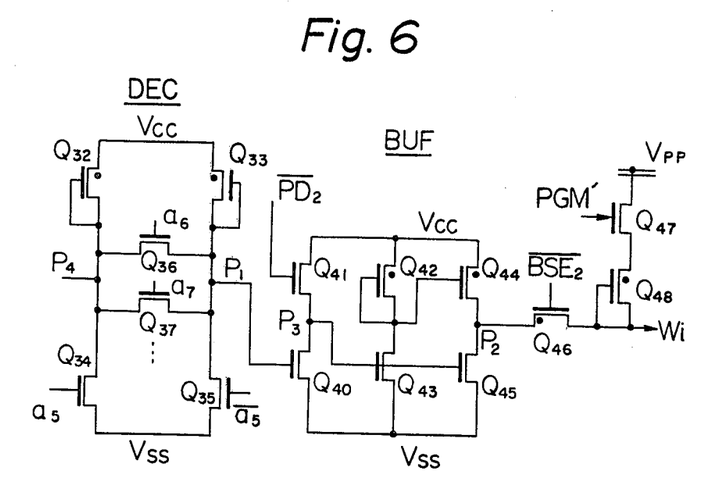
FIG. 6 is a circuit diagram illustrating a row decoder circuit used in the EPROM device of FIG. 5.

FIG. 6 illustrates an example of a row decoder RD used in the EPROM device of FIG. 5. In FIG. 6, DEC designates a decoder section of a word line Wi (i=0, 1, 2, ...) which comprises transistors Q32 through Q37.

BUF designates a buffer section comprising transistors Q40 through Q48 and including the gate section illustrated in FIG. 5. The transistors each having a dot mark "." are depletion type MIS transistors. In FIG. 6, a5, a6, . . . are address bit signals of a buffered word address signal. The address bit signal a5 is a least significant bit of the buffered word address signal, and the address bit signal a5 and the inverted signal $\overline{a5}$ thereof are supplied also to decoder sections of the other row decoders connected to the other word lines and not shown in the FIG. 6 drawing. If there are four word lines of the EPROM device and two address bits, the transistor Q37 is not used in the decoder section DEC. However, if there are more than four word lines and, therefore, more than two address bits the transistors Q37, Q38, . . . which are connected parallel to the transistor Q36 and which receive address bits a7 or $\overline{a7}$, a8 or $\overline{a8}$, . . . respectively are added to the decoder section DEC. Assume that there are four word lines and that two bit address signals (a5, a6), are used. In this condition, if the address bit signals a5, $\overline{a5}$, and a6 are applied to the gate electrodes of the transistors Q34, Q35, and Q36, respectively, and if a5=1 and a6=0, then the transistor Q34 is turned on and the transistors Q35 and Q36 are both turned off. Therefore, the output node P1 of the decoder section DEC becomes high and the transistor Q40 of the buffer section BUF is turned on. Since the modified powerdown signal $\overline{PD2}$ is high in an active mode, i.e., in an write-in or a readout mode, the transistor Q41 is turned on. The gm or transconductance ratio of the transistors Q41 and Q40 is selected so that the potential level of a node P3 becomes low when both the transistors Q41 and Q40 are turned on. Therefore, the transistors Q43 and Q45 are turned off and an output node P2 of the buffer section BUF is raised to the potential Vcc of the power supply voltage, so that the word line Wi is selected. When conditions different from the condition a5=1 and a6=0, exit the potential of the node P1 is low, so that the transistor Q40 is turned off and the transistors Q43 and Q45 are turned on. Therefore, the potential of the output node P2 of the buffer section becomes low and the word lines Wi are not selected. Another output node P4 of the decoder section DEC is connected to a buffer section, (not shown in the drawings) in order to select another word line.

Figure 7:
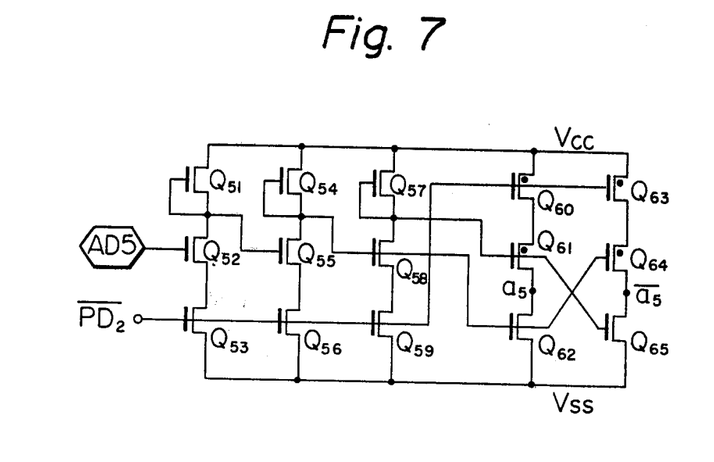
FIG. 7 is a circuit diagram illustrating an address buffer circuit used in the EPROM device of FIG. 5.

FIG. 7 illustrates an address buffer circuit which generates address bit signals a5 and $\overline{a5}$ supplied to the decoder section DEC of the row decoder RD on the basis of an external address bit signal AD5, and which comprises MIS transistors Q51 through Q65. In the circuit of FIG. 7, since the modified powerdown signal $\overline{PD2}$ is high in the active mode, the transistors Q53, Q56, Q59, Q60, and Q63 are turned on. Therefore, in the active mode, the buffered address bit signals a5 and $\overline{a5}$ become low and high, respectively, when the signal AD5 is high, or the buffered address bit signals a5 and $\overline{a5}$ become high and low, respectively, when the signal AD5 is low.

The column decoder CD also has a decoder section and a buffer section for each bit line, which have substantially the same circuit structure as those of the row decoder RD (not shown in the drawings). The column decoder CD receives buffered address bit signals from bit address buffer circuits, each having substantially the same circuit as that illustrated in FIG. 7 and each of which receives an external address bit signal, for example, AD0.

In the row decoder of FIG. 6, during readout of information from a memory cell connected to the word line Wi, the signal $\overline{BSE2}$ is high and the program signal PGM' is low. Therefore, the transistor Q46 is turned on and the transistor Q47 is turned off, so that the potential Vcc of the output node P2 of the buffer section BUF is applied to the word line Wi. In the programming mode, during write-in of data to a selected memory cell, the signal $\overline{BSE2}$ becomes low and the programming signal PGM' becomes high. The potential $V_{pp}$ from another power source having a higher potential than the potential Vcc is applied to the word line Wi through the turned-on transistor Q47 and the transistor Q48, which operates as a resistor, and write-in operation is effected. In this case, if the word line Wi is selected, the transistor Q45 is turned off so that the potential of the point P2 is high, and the signal $\overline{BSE2}$ is low. Therefore, the transistor Q26 is turned off and the potential of the word line Wi becomes $V_{pp}$. If the word line Wi is not selected, the transistor Q45 is turned on so that the potential of the node P2 is low, and although the signal $\overline{BSE2}$ is low, the depletion transistor Q46 is turned on. Therefore, the potential of the word line Wi becomes low. Consequently, the potential of the word line Wi becomes very high, i.e., $V_{pp}$, only when the word line Wi is selected and hot electrons are injected into the floating gate of the memory cell.

In a conventional EPROM device, the threshold potential Vth of the memory cells is measured by changing a power supply voltage Vcc in a readout mode. In this case, only one memory cell is selected at one time by selecting a word line and a bit line. On the other hand, in the EPROM device according to the present invention, the threshold potential Vth is measured by changing the potential $V_{pp}$ of a second power source, which is used for programming, in a test mode. In the test mode, the signals BSE2 and PGM' are changed to low and high respectively, and an output circuit such as the sense amplifier SA is operated.

Figure 8:
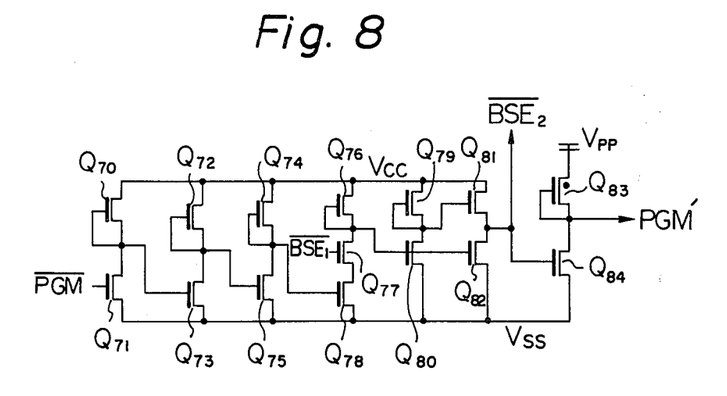
FIG. 8 is a circuit diagram illustrating a switching signal generator used in the EPROM device of FIG. 5.

FIG. 8 is a switching signal generator SSG which generates a modified gate signal $\overline{BSE2}$ and a modified program signal PGM' in order to set the EPROM device in the above-mentioned test mode. The circuit of FIG. 8 comprises MIS transistors Q70 through Q84 and receives a program signal $\overline{PGM}$ from a pin terminal of the EPROM device. The threshold potential of the input transistor Q71 is selected to be higher than the power supply voltage Vcc. Therefore, the transistor Q71 is in a turned-off condition even when the program signal $\overline{PGM}$ having a potential level between zero and Vcc is applied thereto. In this condition, the transistor Q73 is turned on, the transistor Q75 is turned off, and the transistor Q78 is turned on. The signal $\overline{BSE1}$ applied to the transistor Q77 is changed to high in a readout mode and low in a programming mode. Therefore, in the readout mode, when $\overline{BSE1}$ is high, the transistor Q77 is turned on, the transistors Q80 and Q82 are turned off, and the modified gate signal $\overline{BSE2}$ becomes high. In this case, the transistor Q84 is turned on, and the modified program signal PGM' becomes low. In the programming mode, when $\overline{BSE1}$ is low, the transistors Q80 and Q82 are turned on, the signal $\overline{BSE2}$ is low, the transistor Q84 is turned off, and the signal PGM' becomes high, i.e., $V_{pp}$. Therefore, when the input program signal $\overline{PGM}$ has the normal logical level, i.e, the level between zero and Vcc, the signals $\overline{BSE1}$ and $\overline{BSE2}$ change in the same manner and the modified program signal PGM' becomes logically equivalent to the inverted signal of the input program signal $\overline{PGM}$.

However, when the input program signal PGM having a very high potential higher than the threshold potential of the input transistor Q71 is applied to the gate electrode of the input transistor Q71, the transistor Q71 is turned on, the transistor Q73 is turned off, the transistor Q75 is turned on, and the transistor Q78 is turned off. Therefore, regardless of the potential level of the signal BSE1, the transistors Q80 and Q82 are turned on, the modified signal $\overline{BSE2}$ is low, the transistor Q84 is turned off, and the modified program signal PGM' becomes high. In this case, since the input program signal $\overline{PGM}$ is logically high, the memory device is in a readout mode, but the transistor Q47 of the row decoder RD of FIG. 6 is turned on and the transistor Q46 connected to a selected word line is turned off. Thus, the memory device is set in a test mode in which the selected word line is connected to a second power source whose output potential is $V_{pp}$ and in which the output circuit such as the sense amplifier is operated, and the threshold potential Vth of the selected memory cell can be measured by changing the potential $V_{pp}$.

In the memory device according to the present invention, a plurality of word lines and/or bit lines can be selected at the same time in order to decrease the measuring time of the threshold potentials of the memory cells. In this case, the potential of one or more word lines is gradually changed from low, e.g., 0 V to high, e.g., 15 V by changing the potential $V_{pp}$. The potential $V_{pp}$ when the turning on of a memory cell is first detected corresponds to the minimum threshold potential Vth. When the threshold potential Vth is measured for every word line, the minimum threshold potential $V_{th}$ for every word line is detected, the threshold potential Vth is measured for all memory cells of the memory device, and the minimum threshold potential Vth of the memory cell from all the memory cells is measured. To test whether a memory device is usable, it is preferable to measure the minimum threshold potential by using the latter method. However, in a EPROM device having redundant memory cells which can be substituted for unusable memory cells, it is preferable to use the former method. In this case, if a word line with one or more unusable memory cells is detected, the word line can be replaced by a redundant word line with usable memory cells.

When all the memory cells are erased before the measurement of the threshold potential Vth, the threshold potential Vth in the erased state can be measured. It is possible to measure the threshold potential Vth in various conditions, such as the condition in which information "0" is written-in to the memory cells, a condition after the radiation of ultraviolet light onto the memory device a condition after high temperature treatment, or a condition after the memory device is kept at a normal temperature for a period of time. It is also possible to measure the maximum threshold potential of the memory cells of the memory device.

To measure or test the threshold potential Vth of a plurality of memory cells, the present invention uses a modified power-down signal $\overline{PD2}$. The power-down signal $\overline{PD1}$ is originally used for decreasing the power consumption of the memory device. For example, in the aforementioned row decoder RD of FIG. 6, when access to the memory device is not effected, the modified power-down signal $\overline{PD2}$, which is logically equivalent to the signal $\overline{PD1}$ when only a single memory cell is selected, is changed to be low and the transistors Q41, Q43 and Q45 are turned off, so that no current flows through the buffer section BUF and the power that would be consumed by the memory device is saved.

Figure 9:
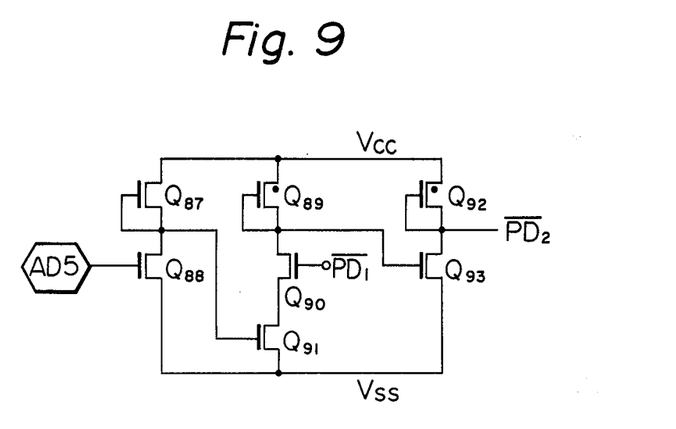
FIG. 9 is a circuit diagram illustrating a powerdown signal generator used in the EPROM device of FIG. 5.

When the threshold potential Vth is measured, the modified power-down signal $\overline{PD2}$ is changed to low by the powerdown signal generator PSG of FIG. 9. The circuit of FIG. 9 comprises transistors Q87 through Q93. The powerdown signal $\overline{PD1}$, which is the same as the powerdown signal $\overline{PD}$ of the conventional EPROM device, is applied to the transistor Q90, and the threshold potential of the transistor Q88, to which one of the bits of the address signal AD5 is applied, is set to be higher than the potential Vcc of the power source. The output signal from the circuit of FIG. 9, i.e., the modified powerdown signal $\overline{PD2}$, is used instead of the powerdown signal $\overline{PD1}$ and is supplied, for example, to the address buffer circuit of FIG. 7.

In the circuit of FIG. 9, when the normal operation is effected, the signal AD5 having a potential level between zero and Vcc is used, and the transistor Q88 is always turned off. Therefore, the transistor Q91 is turned on and the signals $\overline{PD1}$ and $\overline{PD2}$ are logically equivalent to each other. When the threshold potential Vth is measured, the potential of the address bit signal AD5 is changed to very high, higher than Vcc, so that the transistor Q88 is turned on and the transistor Q91 is turned off. Therefore, the transistor Q93 is turned on and the modified powerdown signal $\overline{PD2}$ becomes low regardless of the potential level of the powerdown signal $\overline{PD1}$. As a result, in the address buffer of FIG. 7, the transistors Q53, Q56, Q59, Q60, and Q63 are turned off, so that both the address bit signals a5 and $\overline{a5}$ are forced to be low. Therefore, both the nodes P1 and P4 of the decoder section DEC of the row decoder RD of FIG. 6 become high and the potential of the node P2 of the buffer section BUF becomes high, so that the word line Wi is selected. In this case, since the potential of the node P4 of the decoder section DEC becomes high, another word line connected to a buffer section which is not shown in the drawings and whose input is connected to the node P4 is also selected, and thus a multiselection of word lines is achieved. It should be noted that a plurality of bit lines can also be selected by using bit address buffers each having the same circuit structure as that of FIG. 7. In this case, an address bit signal, for example, AD0 is changed to very high, higher than Vcc, and both the address bit signals $\overline{a0}$ and a0, $\overline{a1}$, and a1, . . . are changed to high.

Consequently, according to the present invention, the threshold potential Vth is measured by changing the potential $V_{pp}$ of the second power source in a condition similar to that of the readout mode except that the selected word line is connected to the second power source by applying the program signal $\overline{PGM}$ having a very high potential, higher than Vcc (hereinafter referred to as a potential of HH level). In the measurement of the threshold potential Vth, all the word lines can be selected by applying the potential of the HH level as the external address bit signal AD5 to the memory device, or all the memory cells of the memory device can be selected by applying the external address bit signals AD5 and AD0 both having the potential of HH level. Therefore, in a condition $\overline{PGM}$=HH, AD5=HH, and AD0=HH, it is possible to measure the minimum (or maximum) threshold potential of all the memory cells of the memory device. In a condition $\overline{PGM}$=HH and AD5=HH, it is possible to test the threshold potential Vth of all the memory cells connected to a particular bit line designated by the bit address signal having address bits, for example, AD0 through AD4. In a condition $\overline{\text{PGM}}$=HH and AD0=HH, it is possible to measure the threshold potential Vth of the memory cells connected to a particular word line.

As mentioned above, in the present invention, since the threshold potential Vth is measured by changing the potential $V_{pp}$ of the second power source, which is originally used for programming, and the potential Vcc of the main power source is not changed, the reference voltage $V_{REF}$ from the reference voltage generator RG does not change, as illustrated by the dotted line of FIG. 4. Therefore, it is possible to measure the threshold potential very precisely. Moreover, since the threshold potential Vth can be simultaneously measured for a plurality of memory cells, it is possible to reduce the measuring time of the threshold potential.

I claim:

1. A semiconductor memory device, comprising:
   a plurality of word lines;
   a plurality of bit lines;
   a plurality of memory cell transistors each of which is disposed at one of the intersections of said word lines and said bit lines and each of which comprises a control gate operatively connected to one of said word lines and a floating gate which stores electrons;
   a first power supply terminal which receives a normal operating voltage;
   a second power supply terminal which receives a programming voltage used for programming the memory device; and
   a gate selection circuit, operatively connected to said first and second power supply terminals and said word lines, which connects said second power supply terminal to one or more selected word lines when the threshold potential of said memory cell transistors is measured, said first power supply terminal being connected to said normal operating voltage having a constant potential, and the potential of said second power supply terminal being changed, thereby measuring said threshold potential.

2. A semiconductor memory device of claim 1, further comprising row decoders operatively connected to said gate selection circuit, said first power supply terminal and said word lines and each having an output terminal, wherein said semiconductor device has a test mode and a readout mode, and wherein the threshold potential is measured in the test mode which is the same as the readout mode except that said one or more selected word lines are connected to said second power supply terminal and are disconnected from said row decoders by said selection circuit.

3. A semiconductor memory device of claim 2, wherein said gate selection circuit comprises:
   first switching transistors each operatively connected between said second power supply terminal and each of said word lines; and
   second switching transistors each operatively connected between the output terminals of each of said row decoders and a corresponding word line, the threshold potential of one or more memory cells being measured by turning on said first transistors and turning off said second transistors connected to selected word lines.

4. A semiconductor memory device of claim 3, wherein said semiconductor memory device has normal logic levels having normal potential levels and is operatively connectable to receive an input signal having a different potential level, and wherein said semiconductor memory device further comprises a switching signal generator, operatively connected to said first and second switching transistors, which supplies control signals to said first and second switching transistors so as to turn on one of said first switching transistors and turn off one of said second switching transistors connected to a selected word line, when said switching signal generator receives the input signal having the different potential level which is different from the normal potential levels of the normal logic signal of said semiconductor memory device.

5. A semiconductor memory device of claim 1, wherein said memory cells of said semiconductor memory device have minimum and maximum values of threshold potential, and wherein said semiconductor memory device further comprises a selecting circuit, operatively connected to said word lines and said bit lines, which can select a plurality of word lines and bit lines at the same time, thereby measuring the minimum or maximum value of the threshold potential of a plurality of memory cells.

6. A semiconductor memory device of claim 5, wherein said semiconductor memory device has a test mode, and wherein said selecting circuit comprises address buffers, operatively connected to said word lines and said bit lines, each of which comprises a noninverting output terminal and an inverting output terminal and can output signals having the same potential level from both said noninverting output terminal and said inverting output terminal in the test mode, thereby selecting a plurality of word lines and bit lines.

7. A semiconductor memory device of claim 6, wherein said semiconductor memory device is operatively connectable to receive a powerdown signal, and wherein each of said address buffers further comprises a control circuit, operatively connectable to receive said powerdown signal, which cuts off or decreases a current flowing into said address buffer when the powerdown signal is inputted thereto.

8. A semiconductor memory device of claim 7, wherein said semiconductor memory device has normal logic signals having normal potential levels and is operatively connectable to receive an input signal having a different potential level from the normal logic signals, and wherein said semiconductor memory device further comprises a powerdown signal generator, operatively connected to said address buffers and to receive the input signal, which supplies said powerdown signal to said address buffers when the input signal having the different potential level which is different from the potential levels of the normal logic signals is applied thereto.

9. A semiconductor memory device operatively connectable to receive an address signal and a control signal, comprising:
   a first power supply outputting a constant potential;
   a second power supply outputting a variable potential;
   buffer means, operatively connectable to receive the address signal and operatively connected to said first power supply, for passing therethrough the constant potential in dependence upon the address signal;

a gate selection circuit, operatively connectable to receive the control signal and operatively connected to said buffer means and said second power supply, for outputting the constant potential or the variable potential in dependence upon the control signal; and a memory cell operatively connected to said gate selection circuit.

10. A semiconductor memory device of claim 9, wherein said gate selection circuit comprises:

a first transistor operatively connectable to receive the control signal and operatively connected to said second power supply;

a second transistor operatively connectable to receive the control signal and operatively connected to said buffer means and said memory cell; and a third transistor operatively connected to said first transistor, said second transistor and said memory cell.

* * * * *

UNITED STATES PATENT AND TRADEMARK OFFICE
CERTIFICATE OF CORRECTION

PATENT NO. : 4,423,492

DATED : DECEMBER 27, 1983

INVENTOR(S) : MASANOBU YOSHIDA

Page 1 of 2

It is certified that error appears in the above-identified patent and that said Letters Patent is hereby corrected as shown below:

```
Col. 1, line  8, "electrically" should be --Electrically--;
        line 24, "into" should be --onto--;
        line 31, after "18" insert --that is--.

Col. 4, line 49, "OE" should be --OE--; and
                 "CE" should be --CE--;
        line 54, "write in" should be --write-in--;
        line 57, "writein" should be --write-in--.

Col. 5, line 29, "an" should be --a--;
        line 39, ", exit" should be --exist,--;
        line 45, delete ",";
        line 53, "PD2" should be --PD2--.

Col. 6, line 38, "BSE2" should be --BSE2--.
```

UNITED STATES PATENT AND TRADEMARK OFFICE
CERTIFICATE OF CORRECTION

PATENT NO. : 4,423,492

DATED : DECEMBER 27, 1983

INVENTOR(S) : MASANOBU YOSHIDA

It is certified that error appears in the above-identified patent and that said Letters Patent is hereby corrected as shown below:

Col. 7, line 3, "PGM" should be --$\overline{PGM}$--;
      line 62, "power-down" (both occurrences) should be --powerdown--;
      line 67, "power-down" should be --powerdown--.

Col. 8, line 6, "power-down" should be --powerdown--;
      line 48, "$\overline{a0}$ and a0, $\overline{a1}$, and" should be --$\overline{a0}$, a1, and $\overline{a1}$,--;
      line 49, delete "a1,".

Signed and Sealed this

Fifth Day of June 1984

[SEAL]

Attest:

GERALD J. MOSSINGHOFF

Attesting Officer     Commissioner of Patents and Trademarks